(12) United States Patent
Nakamura

(10) Patent No.: US 9,559,042 B2
(45) Date of Patent: Jan. 31, 2017

(54) SEMICONDUCTOR DEVICE

(71) Applicant: FUJI ELECTRIC CO., LTD., Kawasaki-shi (JP)

(72) Inventor: Hideyo Nakamura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 15/092,069

(22) Filed: Apr. 6, 2016

(65) Prior Publication Data

US 2016/0233146 A1    Aug. 11, 2016

Related U.S. Application Data

(63) Continuation of application No. PCT/JP2014/059679, filed on Apr. 1, 2014.

(51) Int. Cl.
*H01L 23/02* (2006.01)
*H01L 23/06* (2006.01)
(Continued)

(52) U.S. Cl.
CPC .......... *H01L 23/4924* (2013.01); *H01L 23/24* (2013.01); *H01L 23/3178* (2013.01);
(Continued)

(58) Field of Classification Search
CPC .......... H01L 23/12; H01L 23/14; H01L 23/15; H01L 23/31; H01L 23/3142; H01L 23/4924; H01L 23/49838; H01L 21/2003; H01L 21/2007; H01L 21/3205; H01L 21/4807; H01L 21/481; H01L 21/67356; H01L 29/06; H01L 29/0603; H01L 29/0684; H01L 29/51; H01L 27/01; H01L 27/0203; H01L 27/06; H01L 27/12; H01L 27/1203; H01L 27/1218; H01L 27/1248; H01L 25/0652; H01L 25/0655; H01L 25/0657
See application file for complete search history.

(56) References Cited

U.S. PATENT DOCUMENTS 5,365,106 A    11/1994  Watanabe
9,059,009 B2*  6/2015   Horio .................. H01L 25/0655
(Continued)

FOREIGN PATENT DOCUMENTS

JP    H06-140548 A    5/1994
JP    H07-078921      3/1995
(Continued)

OTHER PUBLICATIONS

PCT, "International Search Report for International Application No. PCT/JP2014/059679".

*Primary Examiner* — Hsien Ming Lee
(74) *Attorney, Agent, or Firm* — Manabu Kanesaka

(57) ABSTRACT

A semiconductor device includes an insulating substrate having an insulating plate formed of ceramic and a circuit plate fixed on a main face of the insulating plate; a semiconductor element fixed on the circuit plate; a printed circuit board disposed to face the main face of the insulating plate; a ceramic plate disposed to face the main face of the insulating plate, and arranged at a position away from the main face of the insulating plate further than the printed circuit board; a supporting member fixed to the main face of the insulating plate or to the circuit plate, to fix a position of the ceramic plate; and a resin covering the circuit plate, the semiconductor element, the printed circuit board, and the ceramic plate.

10 Claims, 10 Drawing Sheets

(51) Int. Cl.
    *H01L 23/48*           (2006.01)
    *H01L 21/44*           (2006.01)
    *H01L 23/492*          (2006.01)
    *H01L 23/00*           (2006.01)
    *H01L 25/07*           (2006.01)
    *H01L 25/18*           (2006.01)
    *H01L 23/24*           (2006.01)
    *H01L 23/40*           (2006.01)
    *H01L 23/31*           (2006.01)
    *H01L 23/498*          (2006.01)
    *H01L 23/053*          (2006.01)

(52) U.S. Cl.
    CPC .... *H01L 23/4006* (2013.01); *H01L 23/49811* (2013.01); *H01L 23/49838* (2013.01); *H01L 24/01* (2013.01); *H01L 25/07* (2013.01); *H01L 25/18* (2013.01); *H01L 23/053* (2013.01); *H01L 2924/13055* (2013.01); *H01L 2924/13091* (2013.01)

(56) References Cited

U.S. PATENT DOCUMENTS

2007/0267739 A1    11/2007    Kajiwara et al.
2014/0346676 A1    11/2014    Horio et al.

FOREIGN PATENT DOCUMENTS

| JP | 2003-243598 | 8/2003 |
| JP | 2007-311441 A | 11/2007 |
| JP | 2012-129336 | 7/2012 |
| WO | 2013/118415 | 8/2013 |

\* cited by examiner 12A
12Aa 12B
12Ba

12Aa

SEMICONDUCTOR DEVICE

CROSS-REFERENCE TO RELATED APPLICATIONS

This is a continuation application of PCT/JP2014/059679 filed on Apr. 1, 2014, the disclosure of which is incorporated herein.

TECHNICAL FIELD

The present invention relates to a semiconductor device such as a power semiconductor module.

BACKGROUND ART

In a power semiconductor module of which a semiconductor element is mounted on an insulating substrate, an electrode of the semiconductor element is connected electrically to a circuit plate of the insulating substrate with a bonding wire. Recently, a power semiconductor module employing a conductive post instead of the bonding wire is known as disclosed in Patent Literatures 1 and 2. In the power semiconductor module employing the conductive post, one end of the conductive post is connected to the electrode of the semiconductor element, and one end of another conductive post is also connected to the circuit plate of the insulating substrate. Further, the other ends of these conductive posts are connected to wiring film of a printed circuit board which is set so as to face the insulating substrate on which the semiconductor element is fixed. Then this results in an electrical connection between the semiconductor element and the circuit plate of the insulating substrate. The power semiconductor module having such a structure can be miniaturized in comparison with the power semiconductor module having the bonding wire, and have advantages of reducing the inductance of the wiring and accommodating high speed switching.

Moreover, for the power semiconductor module, a resin case in which the semiconductor element and the insulating substrate are accommodated has been filled and sealed with silicone gel. Furthermore, it is recently known that the semiconductor element and the insulating substrate are sealed with insulating thermosetting resin molded by transfer molding in the power semiconductor module. As described above, when sealed with the transfer molded resin, various members such as the semiconductor element and a printed circuit board located inside can be fixed with the resin. Then this leads the power semiconductor module to attain high reliability against power cycle when it is in use.

CITATION LIST

Patent Literature

Patent Literature 1: Japanese Unexamined Patent Application Publication No. 2012-129336
Patent Literature 2: WO2013/118415A1

DISCLOSURE OF INVENTION

Problem to be Solved by the Invention

However, there is a problem that the power semiconductor module, which is molded and then has structure sealed with resin, will warp in its external form so that a heat dissipating surface where an insulating substrate is placed becomes convex at normal temperature. This is due to the sealing resin having a linear expansion coefficient different from that of a ceramic insulating plate which is a part of an insulating substrate. Namely, the reason presumably comes from that the resin is forced to become flat in a mold during molding and then the molded resin shrinks more greatly than the insulating substrate after molding.

With a large amount of warpage, stress is applied to the direction to which the heat dissipating surface is corrected to become flat in the power semiconductor module when the heat dissipating surface of the power semiconductor module is screwed to a flat mounting surface of equipment. The stress is not preferable in view of reliability. Further, when some additional processing is applied to make the heat dissipating surface of the power semiconductor module flat, the stress described above is not applied when the power semiconductor module is mounted. However, even in this case, the heat dissipating surface of the power semiconductor module will deform repeatedly because of the package temperature change coming from heat generated repeatedly from the semiconductor element during operation of the power semiconductor module. As a result, a grease-like compound, which is formed between the mounting surface of the equipment and the heat dissipating surface of the power semiconductor module to improve thermal conductivity, will be squeezed outward. Then, it is liable that sufficient heat dissipation could not be assured during long term operation of the power semiconductor module.

To manage the warping of the heat dissipating surface, the deformation may be reduced by increasing a quantity of filler added to the resin to reduce the linear expansion coefficient of the sealing resin or increasing the thickness of the resin to improve the rigidity. However, even if the quantity of filler is increased for the resin employed in the power semiconductor module, adjusting the linear expansion coefficient of the resin to have the same linear expansion coefficient as the insulating plate made of ceramic is difficult. Furthermore, since increasing the resin thickness is against the demand for package miniaturization, there is a limit. Therefore, warping normally occurs in extent of several tens to 100 μm.

If the compound or a heat dissipation sheet having a thickness equal to or more than 100 μm is formed between the mounting surface of the equipment and the heat dissipating surface of the power semiconductor module, problems which come from warping of the heat dissipating surface are solved to a certain extent. However, when the compound or the heat dissipation sheet becomes thick, heat dissipation capability will decrease. In the power semiconductor module miniaturized and resulted in having a smaller heat dissipating area in the heat dissipating surface, sufficient heat dissipation cannot be achieved unless the thickness of the compound or the heat dissipation sheet is reduced to 25 to 50 μm. As a result, there are also some cases wherein the semiconductor element temperature cannot be kept to be equivalent to that of a large power semiconductor module fabricated using bonding wires.

Changing the insulating plate from the insulating plate made of ceramic to that made of resin may be considered. However, the use of the insulating plate made of resin results in the insulating performance deterioration and also causes the thermal resistance to increase by several times in comparison with that made of ceramic.

In view of circumstances described above, an object of the present invention is to provide a small size semiconductor device including an insulating substrate and a sealing structure molded with resin, wherein the warpage and thermal deformation are suppressed; the reliability of the mounted semiconductor device is improved; a compound is prevented from being squeezed outward; and a thermal resistance of whole cooling system is reduced by thinning the compound.

Means for Solving Problems

In order to attain the object of the present invention, there is provided a semiconductor device comprising: an insulating substrate having an insulating plate formed of ceramics and a circuit plate fixed on a main face of the insulating plate; a semiconductor element fixed on the circuit plate; a printed circuit board set so as to face the main face of the insulating plate; a ceramic plate set so as to face the main face of the insulating plate, wherein the ceramic plate is located at a distant place from the main face of the insulating plate more than from the printed circuit board; a supporting member fixing a position of the ceramic plate, wherein the supporting member is fixed to the main face of the insulating plate or to the circuit plate; and a resin which covers the circuit plate, the semiconductor element, the printed circuit board, and the ceramic plate.

Effect of the Invention

According to the present invention, there is provided the ceramic plate which is set so as to face the main face of the insulating plate and to be located at a distant place from the main face of the insulating plate more than from the printed circuit board to prevent the heat dissipating surface of the power semiconductor module from warping and deforming thermally, and to improve reliability of the power semiconductor device, reducing thermal resistance of the whole cooling system.

MODES FOR CARRYING OUT THE INVENTION

Embodiments according to a semiconductor device of the present invention will be described concretely using figures.

Figure 1A:
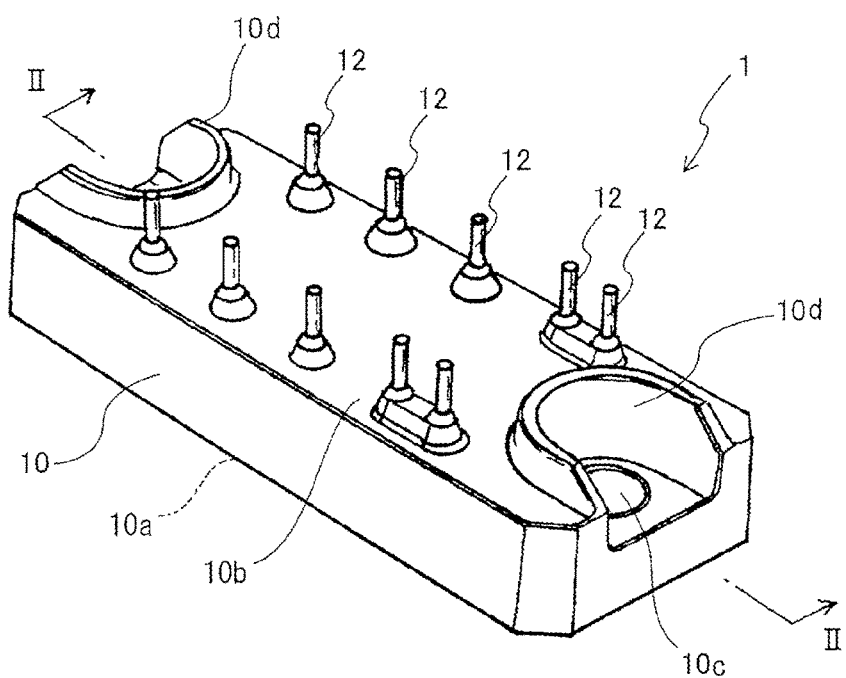
FIGS. 1(a), 1(b) show perspective views of a power semiconductor module according to one embodiment of the semiconductor device of the present invention.
Figure 1B:
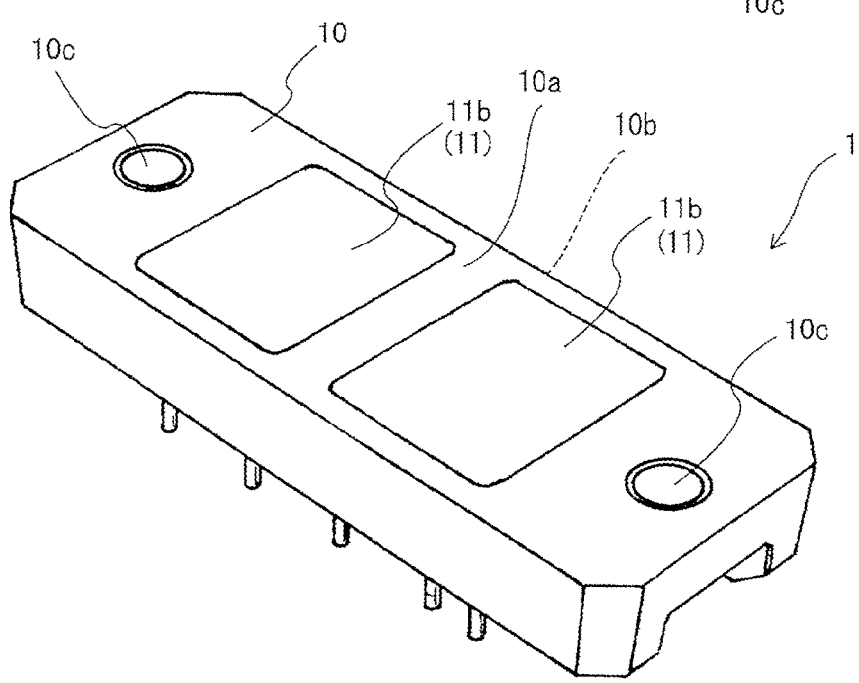

FIGS. 1(a)-1(b) show perspective views of a power semiconductor module 1 according to one embodiment of the semiconductor device of the present invention. FIG. 1(a) is a perspective view illustrating a side where an external connection terminal 12 of the power semiconductor module 1 protrudes. FIG. 1(b) is a perspective view illustrating a heat dissipating surface side. The power semiconductor module 1 shown in the figures has an approximately cuboid shape and includes two insulating substrates 11 set in a first face (heat dissipating surface) 10a of a resin 10 so that metal plates 11b thereof are exposed. The power semiconductor module 1 is lightweight and inexpensive because it does not include a copper plate used for thermal diffusion separately in the first face 10a of the resin 10.

Moreover, each part of the plurality of external connection terminals 12 is set so as to protrude from the inside of the resin 10 to a second face 10b which is approximately parallel to the first face 10a of the resin 10. An instance shown in figures illustrates a 2-in-1 power semiconductor module.

Screw holes 10c for screwing the module to amounting surface of equipment are formed on the both longitudinal edges of the power semiconductor module 1. Furthermore, insulating walls 10d, which have a preferable shape to ensure a creeping distance sufficiently against the screw hole, are formed around the screw holes 10c on the second face 10b of the power semiconductor module 1.

Figure 2:
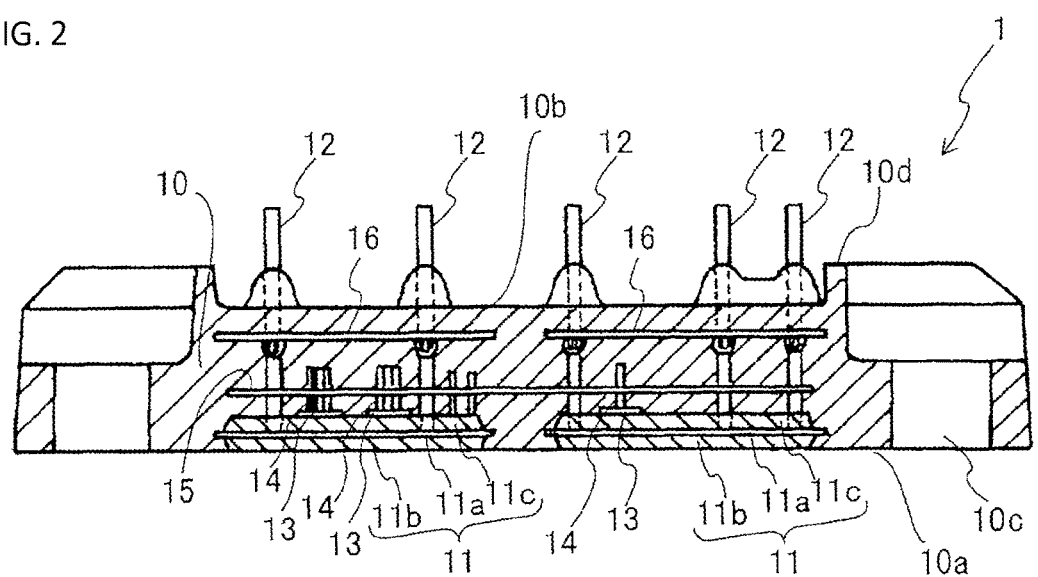
FIG. 2 is a cross section view of the power semiconductor module taken along the line II-II in FIG. 1(a).

FIG. 2 is a cross section view of the power semiconductor module 1 taken along the line II-II in FIG. 1(a). The insulating substrate 11 is set in substantially the same plane with the first face 10a of the resin 10. The insulating substrate 11 includes an insulating plate 11a formed of ceramics, a metal plate 11b, and a circuit plate 11c. The circuit plate 11c is fixed to the main face of the insulating plate 11a. The metal plate 11b is fixed to the face on the opposite side of the main face of the insulating plate 11a, being exposed from the first face 10a of the resin 10.

The insulating plate 11a is formed of ceramics such as $Al_2O_3$, AlN, and $Si_3N_4$ having relatively high thermal conductivity.

An active metal brazed copper (AMB) substrate is formed so that the insulating plate 11a is brazed with copper plates which are material of the metal plate 11b and the circuit plate 11c, the copper plates being patterned by etching. The AMB substrate can be employed as the insulating substrate 11. Further the insulating substrate 11 may be a direct copper bond (DCB) substrate in which the insulating plate 11a is bonded directly to the copper plates composing the metal plate 11b and the circuit plate 11c. The thickness of the metal plate 11b and the circuit plate 11c in the insulating substrate 11 are preferably equal to or more than 0.5 mm considering thermal diffusion and terminal matching. As a method of thickening the copper plate of the AMB substrate, a thick copper plate may be connected directly to the insulating plate 11a and then be etched. As another method of thickening the copper plate of the AMB substrate, a thinner copper plate may be connected to the insulating plate 11a, etched, and then bonded to a copper block together afterward by diffusion bonding or sintering.

A semiconductor element 13 is fixed to the circuit plate 11c disposed on the main face of the insulating plate 11a with a conductive bonding material such as solder (not shown). The semiconductor element 13 is a switching element such as an insulating gate bipolar transistor (IGBT) and a power MOSFET or a diode such as a free-wheeling diode (FWD). Such a combination of the switching element and the diode can form a so-called 2-in-1 power semiconductor module. A plurality of switching elements and diodes are also mounted behind the semiconductor element 13 in the circuit plate 11c but not depicted in FIG. 2.

The external connection terminal 12 is fixed to the circuit plate 11c disposed on the main face of the insulating plate 11a with the conductive bonding material such as solder (not shown). It is preferable that a convex portion and/or a recessed portion are formed on a part of the surface of the external connection terminal 12 in order to increase strength against pulling-out force, creating anchoring effect to the resin 10. The bonding material for fixing the external connection terminal 12 and the semiconductor element 13 to the circuit plate 11c is not limited to solder and may be a metal sintering material or the like.

One end of a conductive post 14 is fixed to an electrode of the semiconductor element 13 set on the face on the opposite side of the surface joined to the circuit plate 11c with the bonding material such as solder, for electrical connection. Further, one end of another conductive post 14 is fixed to the circuit plate 11c with the bonding material such as solder, for electrical connection. The other ends of these conductive posts are connected electrically and mechanically to wiring film of a printed circuit board 15 described later. The conductive post 14 is composed of a conductive material such as copper. Because setting a plurality of conductive posts 14 per one electrode of the semiconductor can supply a larger current than one conductive post per one electrode, it is more preferable to set a plurality of conductive posts 14 per one electrode of the semiconductor element 13 than one conductive post per one electrode.

The printed circuit board 15 is set so as to face the main face of the insulating plate 11a to which the circuit plate 11c is fixed. The other ends of the conductive posts 14 described above are fixed to the wiring film of the printed circuit board 15 with the bonding material such as solder, resulting in electrical connection. Wiring by using the conductive post 14 and the printed circuit board 15 is employed rather than the conventional bonding wires. Then the power semiconductor module 1 according to the present embodiment can be miniaturized in comparison with the module employing conventional wire bonding. In addition, the inductance of the wiring can be reduced more than the conventional wiring, so that it is adaptive to high speed switching operation.

The conductive post 14, which is in a state of piercing through a through-hole of the printed circuit board 15, is connected to the printed circuit board 15 electrically and mechanically by joining with solder or by re-melting a surface of the post. It is preferable that the printed circuit board having the conductive post is formed before the power semiconductor module 1 is assembled. Furthermore the printed circuit board 15 is not limited in particular. A commonly available printed circuit board having a wiring film thickness of several tens to 100 μm is sufficient. However, if temperature during bonding, high temperature use after shipment, and formability and temperature during molding are taken into consideration, a flexible printed circuit board (FPC) composed of a polyimide-resin or the like is preferable because its material has high heat resistance and a thin insulating portion.

A ceramic plate 16, which is located at a distant place from the main face of the insulating plate 11a more than from the printed circuit board 15, is set so as to face the main face of the insulating plate 11a to which the circuit plate 11c is fixed.

Moreover, the resin 10 is placed to cover the circuit plate 11c, the semiconductor element 13, the printed circuit board 15, and the ceramic plate 16. The resin 10 has the first face 10a which forms almost the same plane as the insulating substrate 11 and the second face 10b which is almost parallel to the first face 10a as described earlier. A thermosetting resin composed of such as an epoxy-resin, a polyimide-resin, a silicone-resin, a phenol-resin, and an amino-resin can be employed as the resin 10.

The first face 10a portion of the resin 10 can have almost the same linear expansion coefficient as the second face 10b portion because the ceramic plate 16 is set at the position nearer to the second face 10b of the resin 10. Then, during manufacturing the power semiconductor module 1, when the resin 10 shrinks thermally after molding, the thermal shrinkage in the first face 10a portion becomes equivalent to that in the second face 10b portion. This suppresses the first face 10a from warping in a curved surface shape and reduces the stress, which is applied to the direction to which warpage is corrected, even though the power semiconductor module 1 is screwed on the mounting flat surface of the equipment. Thus the power semiconductor module 1 can attain high reliability.

Further, even though the semiconductor element 13 generates heat repeatedly during the use of the power semiconductor module 1, thermal expansion and shrinkage are similarly applied to both the first face 10a portion and the second face 10b portion. This can suppress stress created by power cycle from acting to the inside part of the module. Namely, since heat deformation can be suppressed in the resin 10, the power semiconductor module 1 attains high reliability also in this regard. Moreover, a compound, which is set between the mounting face of the equipment and the power semiconductor module 1, can be suppressed from being pushed out by the heat deformation in use. Thus, the power semiconductor module 1 can attain high reliability also in this regard.

As described above, warpage can be suppressed in the first face 10a of the resin 10 both after manufacturing the power semiconductor module 1 and when it is in use. Thus, it is not necessary to perform scraping process on the first face 10a. Furthermore, as there is no restriction on the presence or absence of filler and on the filler quantity added when choosing the resin 10, the resin can be selected more suitably. Further, as there is no need to increase rigidity by thickening the resin 10 in order to prevent it from warping, this does not inhibit the resin 10 from being miniaturized. In addition, as the compound and a heat dissipation sheet can be reduced in thickness, this allows heat dissipation to improve when the power semiconductor module 1 is mounted.

Furthermore, the use of the ceramic plate 16 eliminates the warpage so that there is no need to alter the insulating plate 11a of the insulating substrate 11 to an insulating plate composed of resin. This avoids decreasing in insulation resistance and increasing in thermal resistance which would occur in the case of using the insulating plate composed of resin.

The material of the ceramic plate 16 is not particularly limited, and there is no particular problem if the ceramic plate 16 has a closer linear expansion coefficient to the material of the insulating plate 11a than the resin 10 and is made of material resistant to bending and stress. Moreover, it is more preferable to make the ceramic plate 16 from the same material as the insulating plate 11a to secure the same linear expansion coefficient. Further, as described later, according to the present embodiment, as the ceramic plate 16 is supported with the external connection terminal 12 or fixed therewith, it is preferable that the ceramic plate 16 has insulation property. In addition, the ceramic plate 16 may be a single ceramic body. It may be also the AMB substrate or the DBC substrate which has a conductive layer on either one surface or both surfaces.

During the molding process for manufacturing the power semiconductor module 1 according to the present embodiment, a device to retain the position of the ceramic plate 16 is required in spite of the resin flow. According to the present embodiment, the ceramic plate 16 is retained by using the external connection terminal 12 as the device described above. That is, according to the present embodiment, the external connection terminal 12 is employed as a supporting member that fixes the position of the ceramic plate 16.

Figure 3:
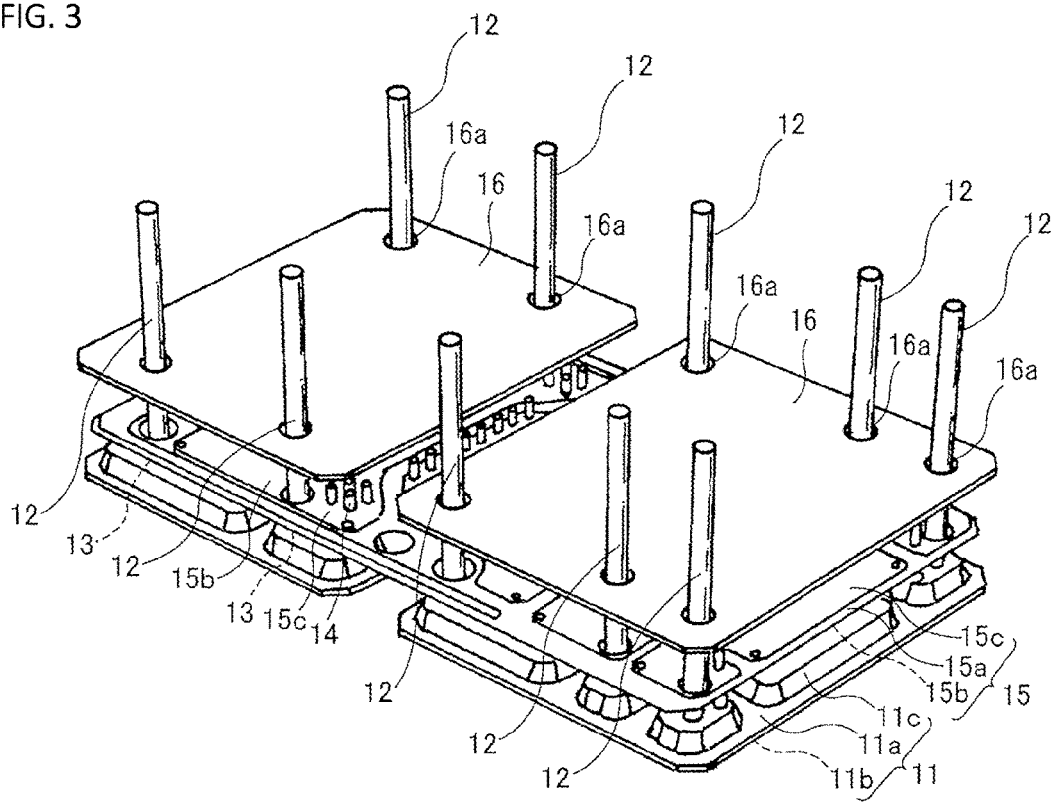
FIG. 3 is a perspective view illustrating internal members of the power semiconductor module according to the one embodiment of the present invention.

FIG. 3 shows a perspective view illustrating internal members of the power semiconductor module 1 according to the present embodiment without the resin 10. According to an aspect of the present embodiment shown in FIG. 3, two sheets of the ceramic plates 16 are set so that they correspond to respective two insulating substrates 11. Each ceramic plate 16 has substantially rectangular plane shape and has almost the same size and thickness as the insulating plate 11a of the insulating substrate 11. In the periphery of the respective ceramic plates 16, a plurality of through-holes 16a is formed so that the through-holes 16a are placed to the respective positions where the external connection terminals 12 are disposed. The through-hole 16a has a diameter capable to pass through the external connection terminal 12.

Figure 4A:
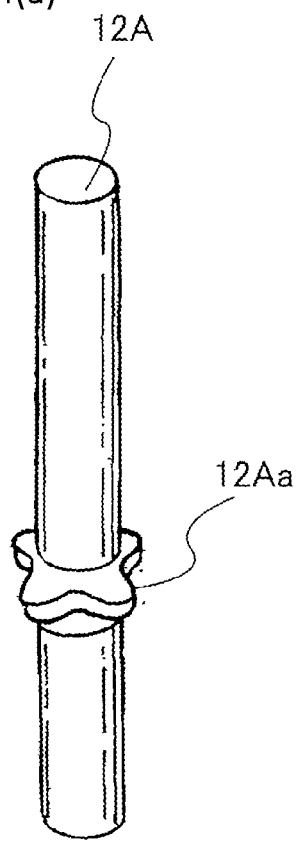
FIGS. 4(a)-4(c) show explanatory drawings of examples of external connection terminals.
Figure 4B:
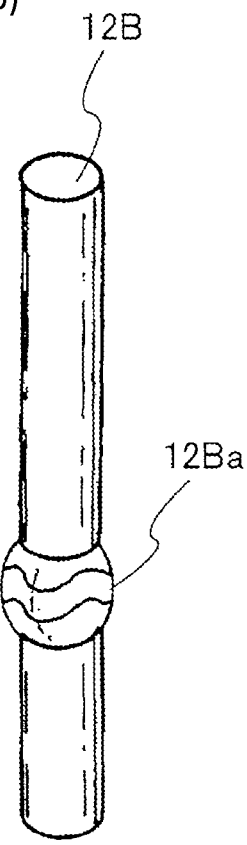
Figure 4C:
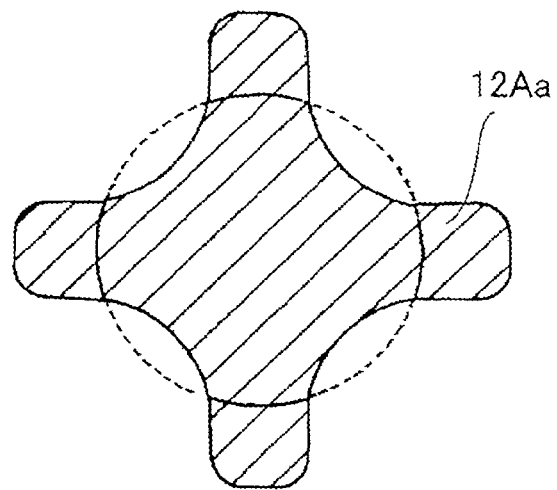

FIGS. 4(a)-4(c) show examples of the external connection terminal 12 working as the supporting member fixing the ceramic plate 16 according to the present embodiment. An external connection terminal 12A shown in FIG. 4(a) has a protrusion 12Aa at a predetermined position. The protrusion 12Aa has a cross-shaped cross section as illustrated in a cross section view in which the cross section is perpendicular to the principal axis of the external connection terminal 12A in FIG. 4(c). The maximum protrusion length of the external connection terminal 12 at the protrusion 12Aa in a diameter direction is greater than the diameter of the through-hole 16a formed in the ceramic plate 16. Therefore, when the through-hole 16a of the ceramic plate 16 is passed through one end of the external connection terminal 12A, the ceramic plate 16 is locked at the position of the protrusion 12Aa of the external connection terminal 12A. Then this allows the position of the ceramic plate 16 to be fixed.

As an alternative to fixing the supporting member to the insulating substrate 11 as described in the present embodiment, the supporting member may be fixed to the printed circuit board 15 to fix the position of the ceramic plate 16. However, as the printed circuit board 15 has a lower rigidity than the insulating substrate 11, it cannot fix the ceramic plate 16 firmly. Thus, the ceramic plate 16 may move when resin is injected into a mold during molding, which might cause deviation in the position of the ceramic plate 16. On the other hand, according to the present embodiment, the problem described above does not occur because the position of the ceramic plate 16 is fixed by using the insulating substrate 11 with high rigidity. Thus, the power semiconductor module 1 with high reliability can be manufactured steadily. Further as described above, by employing the external connection terminal 12 as the supporting member, manufacturing cost can be reduced because there is no need to prepare a separate supporting member.

Furthermore, instead of employing the external connection terminal 12, specific members having structures shown in FIGS. 4(a)-4(c) can be employed as the supporting member. In addition, the supporting member can be fixed not to the circuit plate 11c but to the main face of the insulating plate 11a. In these cases, the supporting member can be placed independently from the external connection terminal to increase the degree of freedom in the internal structure for the power semiconductor module 1.

The protrusion 12Aa of the external connection terminal 12A shown in FIGS. 4(a) and 4(c) can be formed by drawing or a raising process, for example, to a specific position of the external connection terminal 12A. Further, the protrusion 12Aa can be also formed by adhering a locking member, which is prepared separately, to the external connection terminal 12. The protrusion 12Aa of the external connection terminal 12A is not limited to the cross-shape shown in FIG. 4(c). The protrusion 12Aa has an arbitrary shape in the cross section perpendicular to the principal axis and only requires the maximum protrusion length in the diameter direction to be greater than the diameter of the through-hole 16a of the ceramic plate 16.

An external connection terminal 12B shown in FIG. 4(b) illustrates another example of the external connection terminal 12. The external connection terminal 12B is different from the external connection terminal 12A in the shape of the protrusion 12Ba. The protrusion 12Ba, which is formed at a specific position in the total length of the external connection terminal 12B, has a cross-shape in the cross section perpendicular to the principal axis. And then, the maximum protrusion length of the protrusion 12Ba of the external connection terminal 12 in the diameter direction is slightly greater than the diameter of the through-hole 16a formed in the ceramic plate 16. Specifically, the protrusion 12Ba has a size capable to be press-fitted into the through-hole 16a or another size capable to be locked to the ceramic plate 16 under friction force with the through-hole 16a by being pressed to the through-hole 16a. Therefore, the through-hole 16a of the ceramic plate 16 is passed through one end of the external connection terminal 12B and then press-fitted into the protrusion 12Ba or pressed thereto. Then the ceramic plate 16 is locked at the position of the protrusion 12Ba in the external connection terminal 12B. Thus, the position of the ceramic plate 16 can be fixed.

In a case of using a high viscosity resin as the resin 10, if there is a concern over position fluctuation of the ceramic plate 16 due to the resin flow in the mold, the external connection terminal 12B shown in FIG. 4(b) is employed advantageously.

The protrusion 12Ba of the external connection terminal 12B can be formed by performing a raising process to a specific position of the external terminal 12B in a similar manner that the protrusion 12Aa of the external connection terminal 12A is formed described earlier. Further, the protrusion 12Ba can be formed by adhering another locking member, which is prepared separately, to the external connection terminal 12. The protrusion 12Ba of the external connection terminal 12B is not limited to a shape of a cross. The protrusion 12Ba has an arbitrary shape in the cross section perpendicular to the principal axis, and only requires the maximum protrusion length in the diameter direction to be slightly greater than the diameter of the through-hole 16a and have a size capable to be press-fitted into the through-hole 16a or another size capable to generate friction force by being pressed.

The external connection terminals 12, 12A, and 12B are preferably formed from a copper material to reduce electric resistance, and also plated with conductive plating as necessary. The copper material is relatively soft and capable of plastic deformation so that the raising process is easily performed to the protrusions 12Aa and 12Ba. Moreover, the ceramic plate 16 is also locked in the protrusion easily so as to be press-fitted into the through-hole 16a or to be pressed thereto.

Further, materials other than copper may be used when a custom member alternative to the external connection terminal 12 is employed as the supporting member. In this case, it is also preferable to use a material which can be easily deformed plastically.

The position where the ceramic plate 16 is fixed with the supporting member (the external connection terminal 12 according to the present embodiment) is preferably determined so that the ratio of the distance between the first face 10a of the resin 10 to the center of the insulating plate 11a of the insulating substrate 11 in the thickness direction and the distance from the second face 10b of the resin 10 to the center of the ceramic plate 16 in thickness direction is in the range of 1 to 5. The reason comes from that the numerical range allows the linear expansion coefficient of the first face 10a portion in the resin 10 to approach that of the second face 10b portion and then suppresses the resin from warping certainly. More preferably, the ratio described above is in the range of 1 to 4. Further preferably, the ratio described above is approximately 1. The fact that the ratio described above is 1 indicates that the distance from the first face 10a of the resin 10 to the insulating plate 11a is similar to that from the second face 10b of the resin 10 to the ceramic plate 16. Proper adjustment of the ratio described above and parameters concerning the ceramic plate 16 such as material, planar shape, planar size, and thickness can suppress the first face 10a of the resin 10 from warping more suitably. In particular, it is preferable to adjust the parameters described above when the insulating plate 11a is different from the ceramic plate 16 in material, thickness, and shape.

According to the present embodiment shown in FIGS. 1(a) to 3, two sheets of ceramic plates 16 are set so as to correspond to the respective two insulating substrates 11. On the other hand, the ceramic plate 16 may be a single plate having a size which can cover the two insulating substrates 11. The rigidity of the ceramic plate 16 can be further improved when using the single plate of the ceramic plate 16 than when using the two sheets of plates. Then this can suppress the first face 10a of the resin 10 from warping more effectively.

The power semiconductor module 1 according to the present embodiment has a so-called full-mold type structure. As the respective members are fixed with the sealing resin, stress applied to the bonding material which bonds the respective members is suppressed so that the reliability against power cycle and the like is extremely high.

Figure 5:
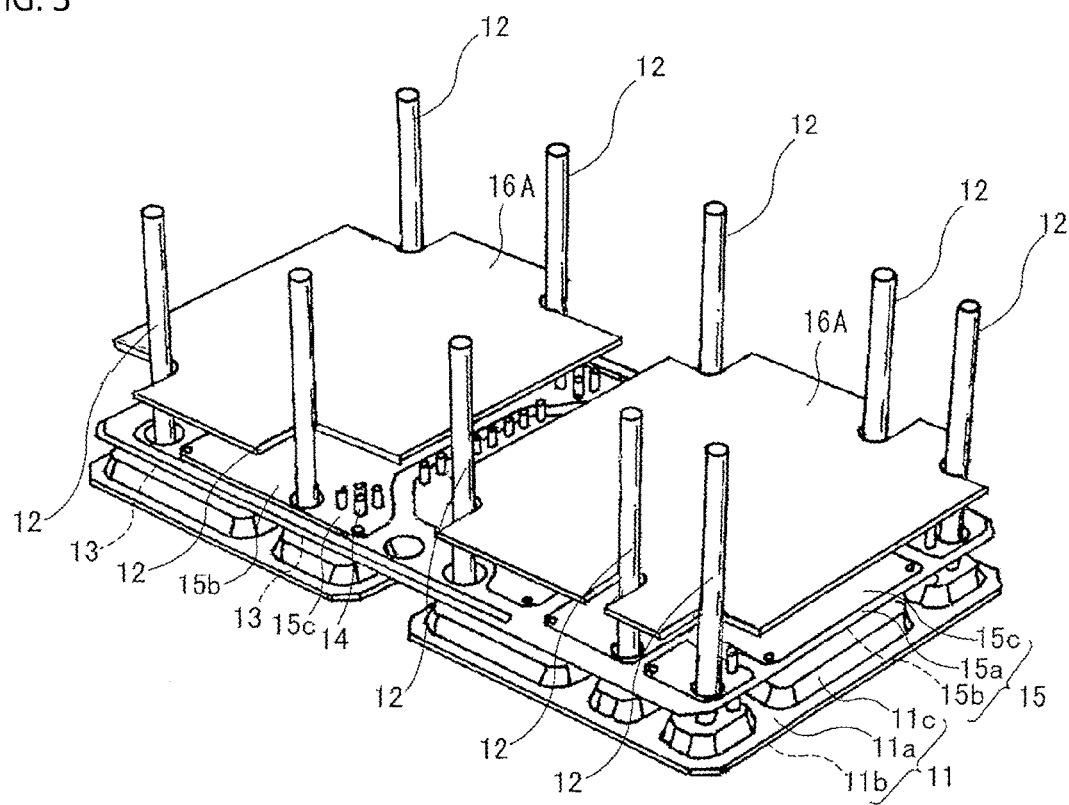
FIG. 5 is a perspective view illustrating internal members of the power semiconductor module according to another embodiment of the present invention.

Another semiconductor device according to another embodiment of the present invention will be described by using FIG. 5. FIG. 5 is a perspective view corresponding to FIG. 3 which illustrates the semiconductor device according to the embodiment described earlier. Further, in FIG. 5, the same reference numerals are given to the respective identical members as those described earlier and redundant descriptions are omitted. The ceramic plate 16A shown in FIG. 5 is different from the ceramic plate 16 shown in FIG. 3 in planar shape. Otherwise the embodiment shown in FIG. 5 has the same constitution as that shown in FIG. 3.

The ceramic plate 16A shown in FIG. 5 has a planar shape in which an area where the external connection terminal 12 is positioned has been cut off so as to avoid colliding with the external connection terminal 12. The position of ceramic plate 16A can be fixed with the protrusion 12Aa of the external connection terminal 12A or with the protrusion 12Ba of the external connection terminal 12B shown in FIGS. 4(a)-4(c). The ceramic plate 16A shown in FIG. 5 has the same effect as the ceramic plate 16 shown in FIG. 3 according to the previous embodiment.

This embodiment is particularly effective when a ceramic material that is difficult to form a hole-shape is employed as the ceramic plate 16.

Figure 6:
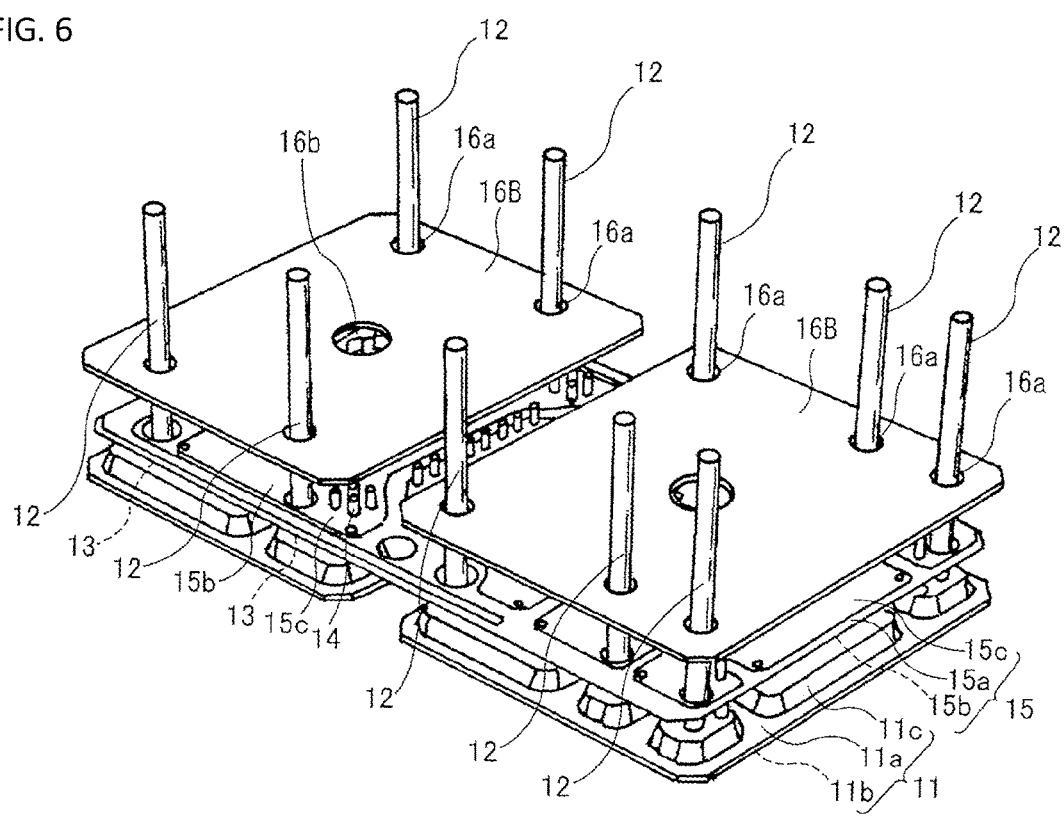
FIG. 6 is a perspective view illustrating internal members of the power semiconductor module according to another embodiment of the present invention.

Still another semiconductor device according to still another embodiment of the present invention will be described using FIG. 6. FIG. 6 is a perspective view corresponding to FIG. 3 illustrating the semiconductor device according to the embodiment described above. Further, the same reference numerals are given to the respective identical members as those described earlier and redundant descriptions are omitted in FIG. 6. The ceramic plate 16B shown in FIG. 6 is different from the ceramic plate 16 shown in FIG. 3 in planar shape. Otherwise, the embodiment shown in FIG. 6 has the same constitution as that shown in FIG. 3.

The ceramic plate 16B shown in FIG. 6 has a resin-flowing-hole 16b at the center thereof. The resin-flowing-hole 16b is useful for resin to flow to the place between the respective members which are located between the ceramic plate 16 and the insulating substrate 11 during molding when manufacturing the power semiconductor module 1. Moreover, it is effective to improve adhesion strength between the ceramic plate 16 and the resin. The resin-flowing-hole 16b can be determined properly in size, position, number, and the like by taking the necessary rigidity for the ceramic plate 16B into consideration.

Next, a method for manufacturing the power semiconductor module 1 will be described.

The semiconductor element 13 is fixed with the bonding material to the circuit plate 11c placed on the main face of the insulating plate 11a. Next, the printed circuit board 15 with conductive posts 14 is prepared in advance, and the conductive posts 14 are aligned to the electrode of the semiconductor element 13 and the circuit plate 11c of the insulating substrate 11 to be fixed with the bonding material. The connection between the printed circuit board 15 with conductive posts 14 and both the semiconductor element 13 and the circuit plate 11c may be performed either simultaneously or separately with the connection between the semiconductor element 13 and the insulating substrate 11.

Next, the external connection terminal 12 is fixed with the bonding material to the circuit plate 11c placed on the main face of the insulating plate 11a. Next, the ceramic plate 16 is locked to the external connection terminal 12, resulting in fixation at the position away from the printed circuit board 15. This can provide assembly of the respective members shown in FIG. 3. The assembly is set into a mold, and then the resin 10, which is the thermosetting resin, is filled in the mold to be cured. The curing temperature is, for example, around 150 to 250° C.

Figure 10:
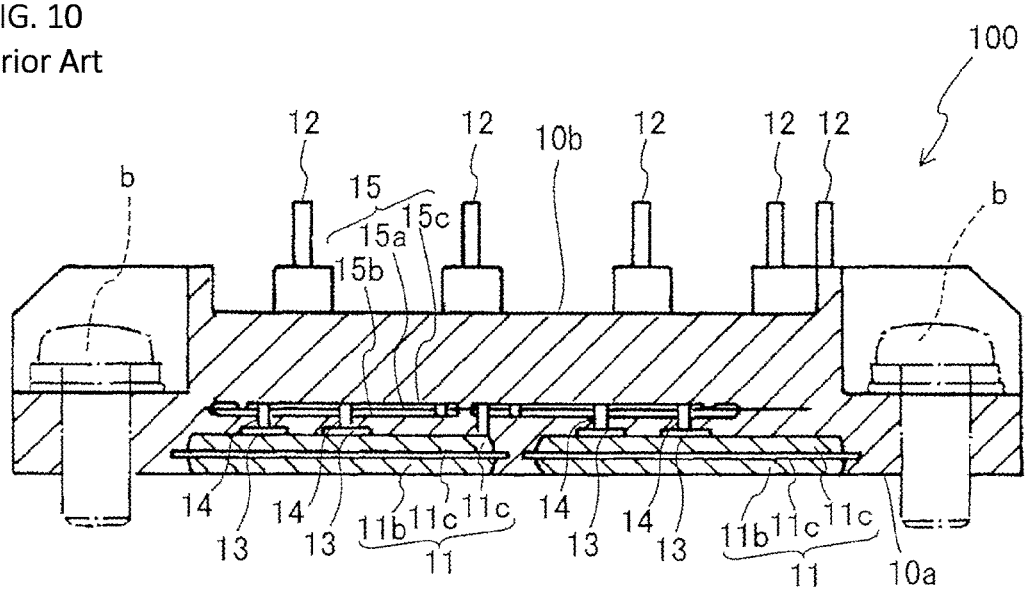
FIG. 10 is a cross section view of a conventional power semiconductor module.

For comparison, a conventional power semiconductor module 100 is shown in FIG. 10 illustrating a cross section view which corresponds to that according to the embodiment of the present invention as shown in FIG. 2. In FIG. 10, the same reference numerals are given to the respective identical members as those shown in FIG. 2 and redundant descriptions are omitted. Furthermore, a reference numeral b indicates a bolt for fixing the power semiconductor module 100.

The power semiconductor module 100 shown in FIG. 10 is different from the power semiconductor module 1 shown in FIG. 2 in that the ceramic plate 16 is absent. Since the power semiconductor module 100 does not include the ceramic plate 16, the first face 10a of the resin 10 warps easily, and the power semiconductor module 100 has a structure in which the amount of warpage is large.

EXAMPLES

In the power semiconductor module 1 having a structure shown in FIG. 2, warpage is examined by preparing three kinds of power semiconductor modules 1A to 1C, in which the respective distances from the second face 10b of the resin 10 to the ceramic plate 16 are altered. Further warpage is examined by using the ceramic plate 16 being the single plate having the size which can cover two insulating substrates 11 and by preparing three kinds of power semiconductor modules 1D to 1F, in which the respective distances from the second face 10b of the resin 10 to the ceramic plate 16 are altered. In addition, warpage is examined by preparing the conventional power semiconductor module 100, which does not have the ceramic plate 16.

Figure 7A:
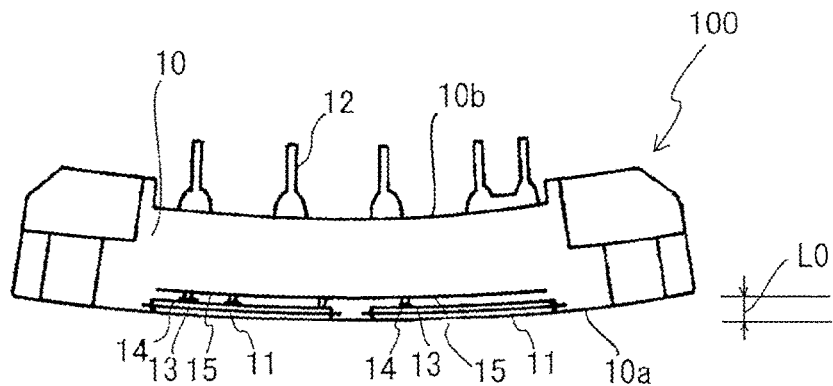
FIGS. 7(a)-7(d) show schematic cross section views of examples 1 to 3 and a comparative example of the power semiconductor modules.

The power semiconductor module 100, which is a comparative example, is shown in FIG. 7(a) illustrating a schematic cross section in which the ceramic plate 16 is absent.

Figure 7B:
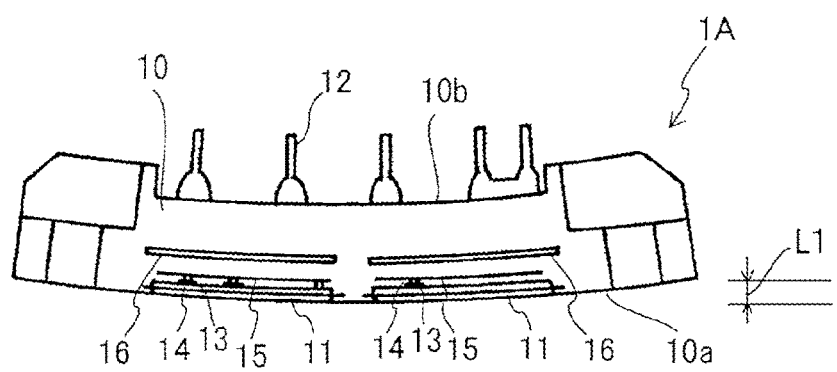

Example 1 shown by a schematic cross section in FIG. 7(b) illustrates a power semiconductor module 1A in which the distance from the second face 10b of the resin 10 to the ceramic plate 16 is long.

Figure 7C:
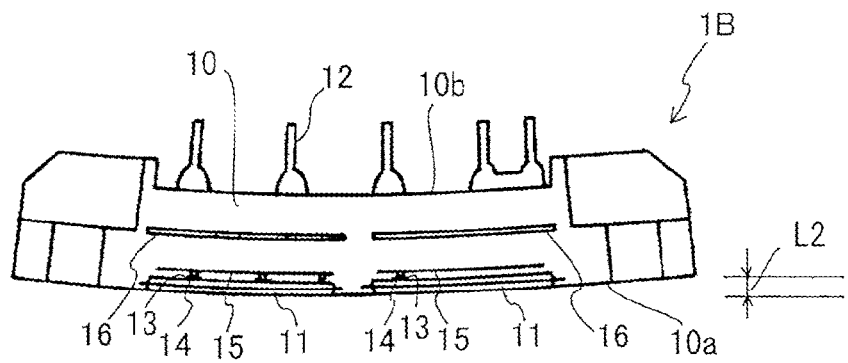

Example 2 shown by a schematic cross section in FIG. 7(c) illustrates a power semiconductor module 1B in which the distance from the second face 10b of the resin 10 to the ceramic plate 16 is medium.

Figure 7D:
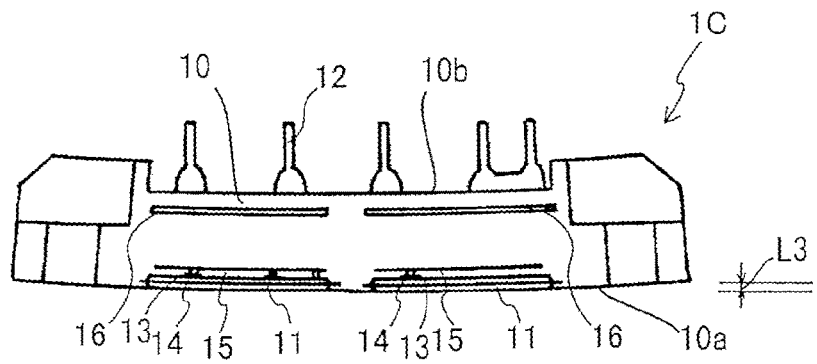

Example 3 shown by a schematic cross section in FIG. 7(d) illustrates a power semiconductor module 1C in which the distance from the second face 10b of the resin 10 to the ceramic plate 16 is short.

Figure 8A:
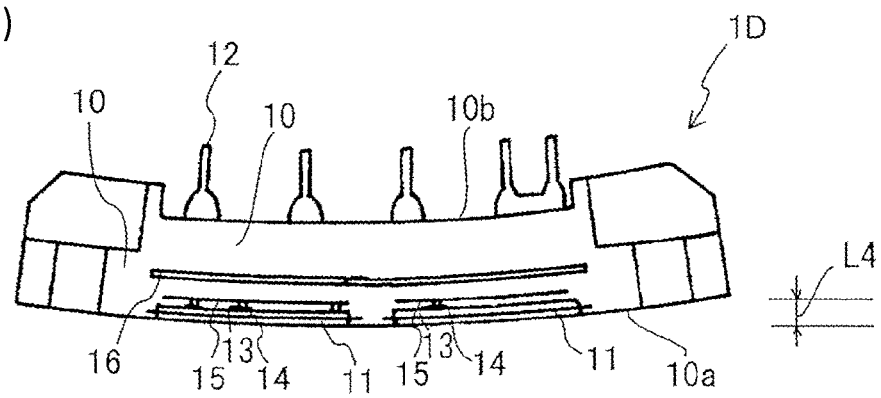
FIGS. 8(a)-8(c) show schematic cross section views of examples 4 to 6 of the power semiconductor modules.

Example 4 shown by a schematic cross section in FIG. 8(a) illustrates a power semiconductor module 1D in which the ceramic plate 16 is a single plate having a size which can cover the two insulating substrate 11, and also the distance from the second face 10b of the resin 10 to the ceramic plate 16 is long.

Figure 8B:
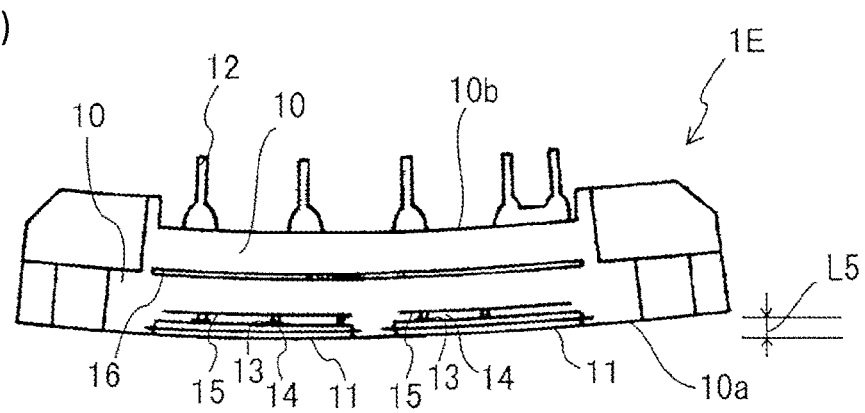

Example 5 shown by a schematic cross section in FIG. 8(b) illustrates a power semiconductor module 1E in which the ceramic plate 16 is a single plate having a size which can cover the two insulating substrates 11, and also the distance from the second face 10b of the resin 10 to the ceramic plate 16 is medium.

Figure 8C:
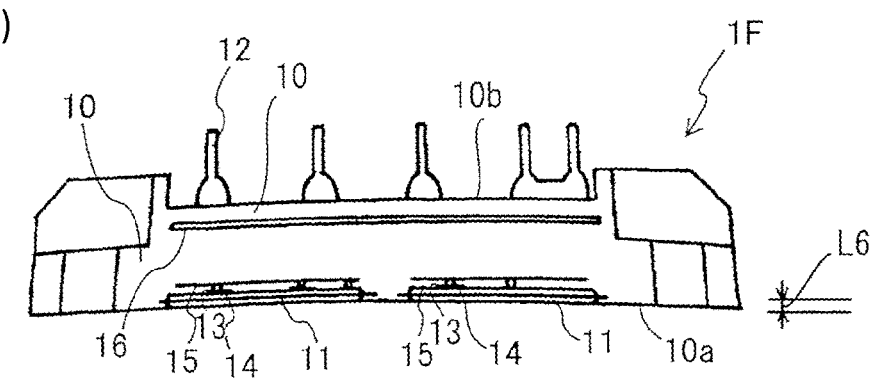

Example 6 shown by a schematic cross section in FIG. 8(c) illustrates a power semiconductor module 1F in which the ceramic plate 16 is a single plate having a size which can cover the two insulating substrates 11, and also the distance from the second face 10b of the resin 10 to the ceramic plate 16 is short.

When each of the power semiconductor modules 1A to 1F and 100, which are the respective examples and the comparative example, respectively, is placed on the flat surface at normal temperature, warpage is evaluated based on the distance from the flat surface to the position where one edge of the resin 10 leaves from the flat surface in a longitudinal direction.

As a result, when comparing among examples 1 to 3, a warpage L2 of the power semiconductor module 1B in example 2 is smaller than a warpage L1 of the power semiconductor module 1A in example 1. And then a warpage L3 of the power semiconductor module 1C in example 3 is smaller than the warpage L2. Further when comparing among examples 4 to 6, a warpage L5 of the power semiconductor module 1E in example 5 is smaller than a warpage L4 of the power semiconductor module 1D in example 4. And then a warpage L6 of the power semiconductor module 1F in example 6 is smaller than the warpage L5. In addition, the power semiconductor module 1F of example 6 has warpage reverse to the other power semiconductor modules 1A to 1E. A warpage L0 of the power semiconductor module 100, which is the comparative example, is larger than each of the power semiconductor modules 1B, 1C, 1E, and 1F which are examples 2, 3, 5, and 6, respectively.

Figure 9:
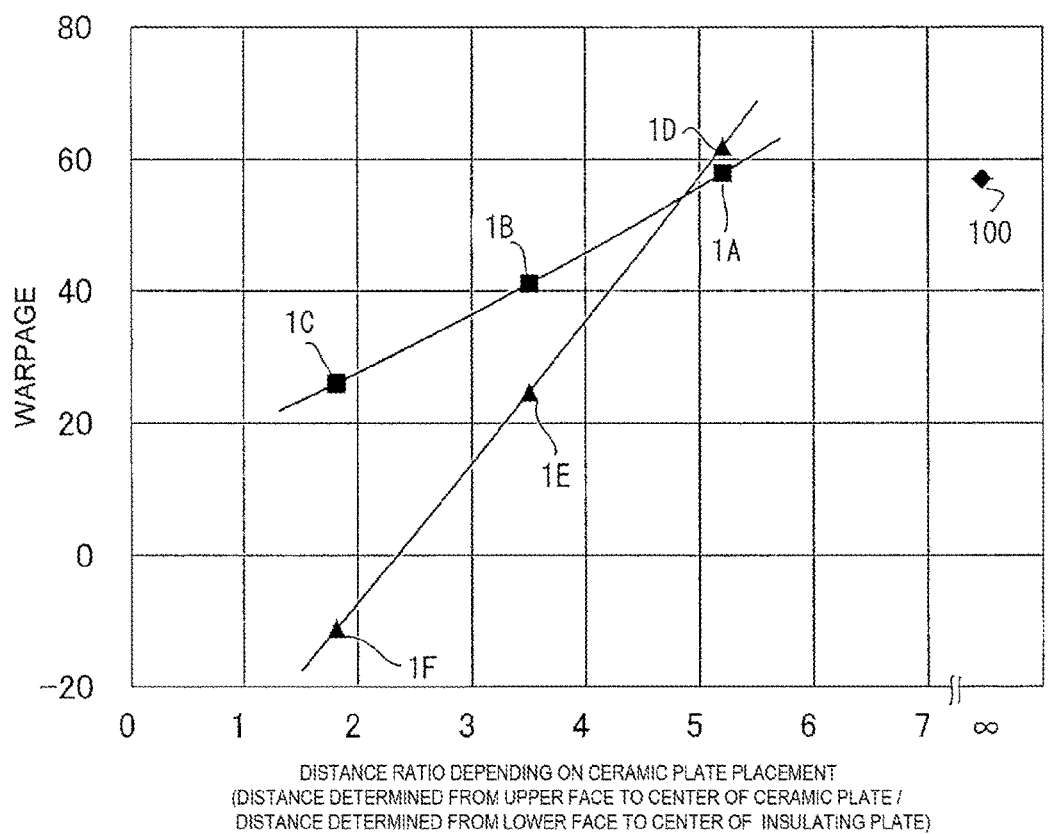
FIG. 9 is a graph illustrating a relationship between warpage and the position where the ceramic plate is set in the power semiconductor module in the examples 1 to 6 and the comparative example.

FIG. 9 shows a result plotted for the examples 1 to 6 and the comparative example of the power semiconductor modules on a graph, in which the horizontal axis indicates the ratio between the distance from the second face 10b of the resin 10 to the ceramic plate and the distance from the first face 10a of the resin 10 to the insulating plate 11a of the insulating substrate 11, and the vertical axis warpage. In addition, the vertical axis indicates relative numerical value in warpage among the power semiconductor modules.

The semiconductor device according to the present invention is described using the respective embodiments and the figures as above. The semiconductor device according to the present invention is not limited to these embodiments and figures. It is possible to modify variously, provided that it does not exceed the gist thereof.

EXPLANATIONS OF LETTERS OR NUMERALS

1: power semiconductor module
10: resin
10a: first face
10b: second face
11: insulating substrate
11a: insulating plate
11b: metal plate
11c: circuit plate
12, 12A, 12B: external connection terminal
12Aa, 12Ba: protrusion
13: semiconductor element
14: conductive post
15: printed circuit board
16, 16A, 16B: ceramic plate

What is claimed is:
1. A semiconductor device comprising:
    an insulating substrate having an insulating plate formed of ceramic and a circuit plate fixed on a main face of the insulating plate;
    a semiconductor element fixed on the circuit plate;
    a printed circuit board disposed to face the main face of the insulating plate;
    a ceramic plate disposed to face the main face of the insulating plate, and arranged at a position away from the main face of the insulating plate further than the printed circuit board;
    a supporting member fixed to the main face of the insulating plate or to the circuit plate, to fix the position of the ceramic plate; and
    a resin covering the circuit plate, the semiconductor element, the printed circuit board, and the ceramic plate.
2. The semiconductor device according to claim 1, wherein the supporting member is an external connection terminal fixed to the circuit plate.
3. The semiconductor device according to claim 2, wherein the external connection terminal has a protrusion fixing the ceramic plate.

4. The semiconductor device according to claim 1, wherein the resin has a first face forming substantially a same plane with the insulating substrate, and a second face parallel to the first face, and
a ratio between a distance from the ceramic plate to the second face and a distance from the insulating plate to the first face is 1 to 5.

5. The semiconductor device according to claim 1, wherein the ceramic plate is composed of a material having a same linear expansion coefficient as the insulating plate.

6. The semiconductor device according to claim 1, wherein the resin is a thermosetting resin composed of at least one material selected from a group consisting of an epoxy-resin, a polyimide-resin, a silicone-resin, a phenol-resin, and an amino-resin.

7. The semiconductor device according to claim 1, further comprising a conductive post connected electrically and mechanically to the semiconductor element and the printed circuit board.

8. The semiconductor device according to claim 1, wherein the ceramic plate includes a hole in which the resin flows.

9. The semiconductor device according to claim 1, wherein the ceramic plate includes a conductive layer.

10. The semiconductor device according to claim 1, wherein the ceramic plate is a single plate.

* * * * *

UNITED STATES PATENT AND TRADEMARK OFFICE
CERTIFICATE OF CORRECTION

| | | |
|---|---|---|
| PATENT NO. | : 9,559,042 B2 | Page 1 of 1 |
| APPLICATION NO. | : 15/092069 | |
| DATED | : January 31, 2017 | |
| INVENTOR(S) | : Hideyo Nakamura | |

It is certified that error appears in the above-identified patent and that said Letters Patent is hereby corrected as shown below:

In the Specification

Please change Column 4, Line 21, from "... to amounting" to --... to a mounting--.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*